(12) United States Patent
Kang et al.

(10) Patent No.: US 8,680,392 B2
(45) Date of Patent: *Mar. 25, 2014

(54) SOLAR CELL AND METHOD OF MANUFACTURING THE SAME

(75) Inventors: Juwan Kang, Seoul (KR); Jihoon Ko, Seoul (KR); Jonghwan Kim, Seoul (KR); Daehee Jang, Seoul (KR)

(73) Assignee: LG Electronics Inc., Seoul (KR)

(*) Notice: Subject to any disclaimer, the term of this patent is extended or adjusted under 35 U.S.C. 154(b) by 57 days.

This patent is subject to a terminal disclaimer.

(21) Appl. No.: 13/564,438

(22) Filed: Aug. 1, 2012

(65) Prior Publication Data

US 2012/0291865 A1    Nov. 22, 2012

Related U.S. Application Data

(63) Continuation of application No. 12/556,113, filed on Sep. 9, 2009, now Pat. No. 8,253,013.

(30) Foreign Application Priority Data

Jun. 4, 2009    (KR) .................. 10-2009-0049657

(51) Int. Cl.
*H01L 31/00* (2006.01)
*H01L 31/0224* (2006.01)

(52) U.S. Cl.
CPC ... *H01L 31/022458* (2013.01); *H01L 31/02245* (2013.01)
USPC ...................................................... 136/256

(58) Field of Classification Search
CPC .................. H01L 31/02245; H01L 31/022458
USPC ....................................................... 136/256
See application file for complete search history.

(56) References Cited

U.S. PATENT DOCUMENTS

| 5,334,259 | A | 8/1994 | Mizumura et al. |
| 2001/0054436 | A1 | 12/2001 | Mukai et al. |
| 2003/0010376 | A1 | 1/2003 | Yamaguchi et al. |
| 2003/0089393 | A1 | 5/2003 | Fath et al. |
| 2006/0060238 | A1 | 3/2006 | Hacke et al. |

(Continued)

FOREIGN PATENT DOCUMENTS

| CN | 101051656 A | 10/2007 |
| CN | 101399293 A | 4/2009 |

(Continued)

OTHER PUBLICATIONS

Clement et al., "Industrially feasible multi-crystalline metal wrap through (MWT) silicon solar cells exceeding 16% efficiency", Solar Energy Materials & Solar Cells, vol. 93, 2009, pp. 1051-1055.

*Primary Examiner* — Jonathan Johnson
*Assistant Examiner* — Allison Bourke
(74) *Attorney, Agent, or Firm* — Birch, Stewart, Kolasch & Birch, LLP (57) ABSTRACT

A solar cell and a method of manufacturing the same are disclosed. The solar cell includes a substrate of a first conductive type having at least one via hole, an emitter layer of a second conductive type opposite the first conductive type on the substrate, a first conductor electrically connected to the emitter layer, a second conductor electrically connected to the first conductor through the via hole, and a third conductor electrically connected to the substrate. The third conductor is electrically separated from the second conductor. A portion of the first conductor and a portion of the second conductor are positioned inside the via hole.

9 Claims, 9 Drawing Sheets

(56) References Cited

U.S. PATENT DOCUMENTS

| | | |
|---|---|---|
| 2007/0235075 A1 | 10/2007 | Park |
| 2007/0277875 A1 | 12/2007 | Gadkaree et al. |
| 2008/0035198 A1 | 2/2008 | Teppe et al. |
| 2008/0223446 A1 | 9/2008 | Wang et al. |
| 2009/0223562 A1 | 9/2009 | Niira et al. |
| 2009/0272419 A1 | 11/2009 | Sakamoto et al. |
| 2010/0275964 A1 | 11/2010 | Kinoshita |
| 2010/0275987 A1 | 11/2010 | Sakamoto et al. |

FOREIGN PATENT DOCUMENTS

| | | |
|---|---|---|
| EP | 2 068 369 A1 | 6/2009 |
| EP | 2 104 147 A1 | 9/2009 |
| JP | 6482570 A | 3/1989 |
| JP | 5-129642 A | 5/1993 |
| JP | 2003-282898 A1 | 10/2003 |
| JP | 2005-101151 A | 4/2005 |
| JP | 2006-302890 A | 11/2006 |
| JP | 2008-34609 A | 2/2008 |
| JP | 2008-517451 A | 5/2008 |
| JP | 2008-270743 A | 11/2008 |
| KR | 10-2007-0009160 A | 1/2007 |
| KR | 10-2007-0099938 A | 10/2007 |
| KR | 10-2008-0032866 A | 4/2008 |
| WO | WO 2006/042698 A1 | 4/2006 |
| WO | WO 2008/050889 A1 | 5/2008 |
| WO | WO 2008-078741 A1 | 7/2008 |
| WO | WO 2008/078771 A1 | 7/2008 |
| WO | WO 2009/071561 A2 | 6/2009 |

SOLAR CELL AND METHOD OF MANUFACTURING THE SAME

This application is a Continuation of U.S. application Ser. No. 12/556,113, filed on Sep. 9, 2009 now U.S. Pat. No. 8,253,013, which claims priority to and the benefit of Korean Patent Application No. 10-2009-0049657 filed in the Korean Intellectual Property Office on Jun. 4, 2009. The entire contents of which are incorporated herein by reference.

BACKGROUND OF THE INVENTION

1. Field of the Invention

Embodiments relate to a solar cell and a method of manufacturing the same.

2. Description of the Related Art

Recently, as existing energy sources such as petroleum and coal are expected to be depleted, interests in alternative energy sources for replacing the existing energy sources are increasing. Among the alternative energy sources, solar cells have been particularly spotlighted because, as cells for generating electric energy from solar energy, the solar cells are able to draw energy from an abundant source and do not cause environmental pollution.

A general solar cell includes a substrate and an emitter layer, formed of a semiconductor, each having a different conductive type such as a p-type and an n-type, and electrodes respectively formed on the substrate and the emitter layer. The general solar cell also includes a p-n junction formed at an interface between the substrate and the emitter layer.

When light is incident on the solar cell, a plurality of electron-hole pairs are generated in the semiconductor. Each of the electron-hole pairs is separated into electrons and holes by the photovoltaic effect. Thus, the separated electrons move to the n-type semiconductor (e.g., the emitter layer) and the separated holes move to the p-type semiconductor (e.g., the substrate), and then the electrons and holes are collected by the electrodes electrically connected to the emitter layer and the substrate, respectively. The electrodes are connected to each other using electric wires to thereby obtain an electric power.

At least one current collector, such as, a bus bar is positioned on each of the emitter layer and the substrate, and the current collector on the emitter layer and the current collector on the substrate are connected to the corresponding electrodes, respectively. Hence, charges collected by the electrode easily move to a load connected to the outside through the current collector adjacent to the electrode.

However, in this case, because the current collectors are respectively formed on one surface of the substrate on which the light is not incident and the other surface of the substrate on which the light is incident (i.e., the emitter layer on an incident surface of the substrate), an incident area of the light is reduced. Hence, the efficiency of the solar cell is reduced.

Accordingly, a metal wrap through (MWT) solar cell was developed so as to prevent a reduction in the efficiency of the solar cell resulting from the current collectors. In the MWT solar cell, a current collector connected to an emitter layer was positioned on a rear surface of a substrate opposite an incident surface of the substrate.

SUMMARY OF THE INVENTION

Embodiments provide a solar cell and a method of manufacturing the same capable of improving an efficiency of the solar cell.

In one aspect there is a solar cell comprising a substrate of a first conductive type having at least one via hole, an emitter layer of a second conductive type opposite the first conductive type on the substrate, a first conductor electrically connected to the emitter layer, a portion of the first conductor being positioned inside the via hole, a second conductor electrically connected to the first conductor through the via hole, a portion of the second conductor being positioned inside the via hole, and a third conductor electrically connected to the substrate, the third conductor being electrically separated from the second conductor.

In another aspect there is a method of manufacturing a solar cell comprising forming at least one via hole on a substrate of a first conductive type, forming an emitter layer of a second conductive type opposite the first conductive type on the substrate, printing a first paste on a portion of an inner space of the via hole and the emitter layer on a rear surface of the substrate around the via hole to form a first conductor pattern and printing a second paste containing having a material that is different from a material of the first paste on the emitter layer on a front surface of the substrate and a remaining portion of the inner space of the via hole to form a second conductor pattern connected to the first conductor pattern, printing a third paste on a remaining portion excluding a formation portion of the first conductor pattern from the rear surface of the substrate to form a third conductor pattern, and performing a thermal process on the substrate having the first, second, and third conductor patterns to form a first conductor using the first conductor pattern, to form a second conductor electrically connected to the first conductor through the emitter layer and the via hole using the second conductor pattern, and to form a third conductor electrically connected to the substrate using the third conductor pattern.

Further scope of applicability of the invention will become apparent from the detailed description given hereinafter. However, it should be understood that the detailed description and specific examples, while indicating embodiments of the invention, are given by illustration only, since various changes and modifications within the spirit and scope of the invention will become apparent to those skilled in the art from this detailed description.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIGS. 3A to 3H are cross-sectional views sequentially illustrating each of stages in a method of manufacturing a solar cell according to an example embodiment;

FIGS. 5A to 5D are cross-sectional views sequentially illustrating each of stages in a method of manufacturing a solar cell according to another example embodiment.

DETAILED DESCRIPTION OF THE EMBODIMENTS

The invention will be described more fully hereinafter with reference to the accompanying drawings, in which example embodiments of the inventions are shown. This invention may, however, be embodied in many different forms and should not be construed as limited to the embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Figure 1:
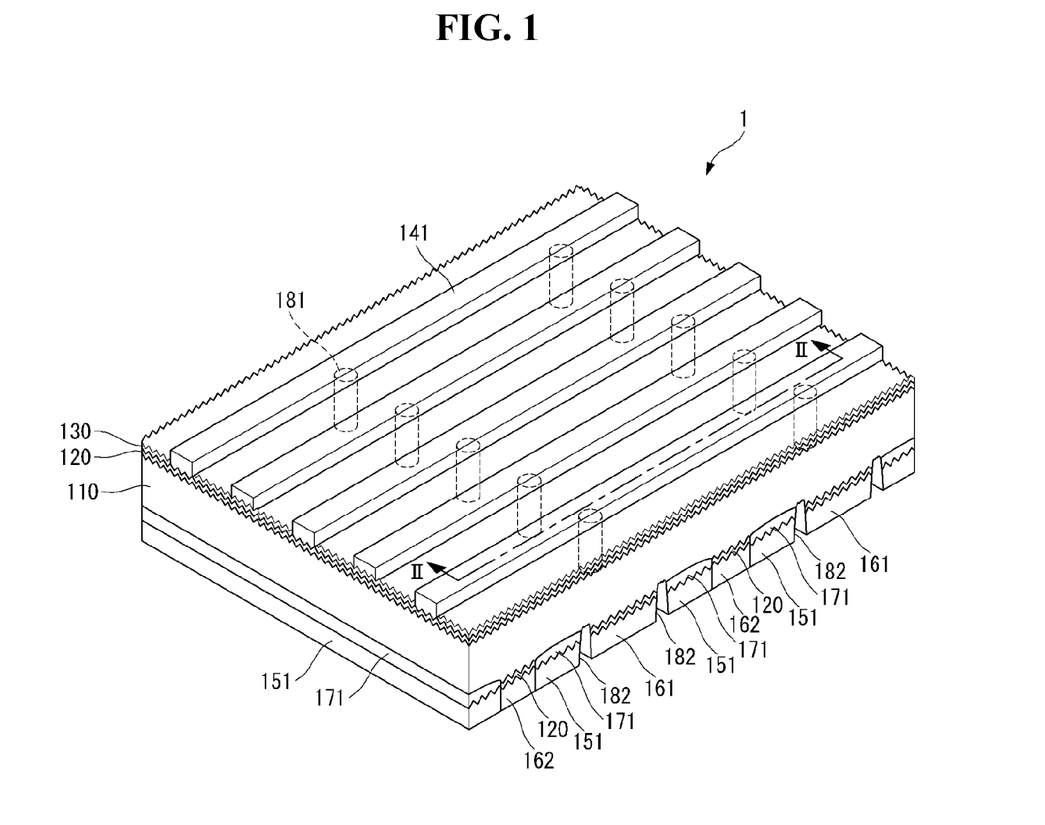
FIG. 1 is a partial perspective view of a solar cell according to an example embodiment.
Figure 2:
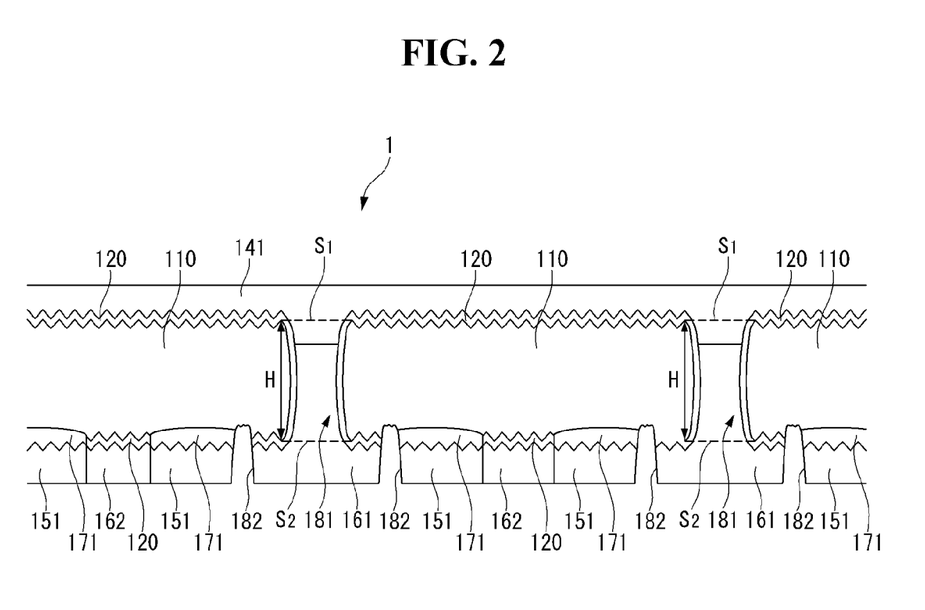
FIG. 2 is a cross-sectional view taken along the line II-II of FIG. 1.

FIG. 1 is a partial perspective view of a solar cell according to an example embodiment. FIG. 2 is a cross-sectional view taken along line II-II of FIG. 1.

As shown in FIG. 1, a solar cell 1 according to an embodiment includes a substrate 110 having a plurality of via holes 181, an emitter layer 120 on the substrate 110, an anti-reflection layer 130 on the emitter layer 120 formed on an incident surface (hereinafter, referred to as "a front surface") of the substrate 110 on which light is incident, a plurality of front electrodes 141, a rear electrode 151, a plurality of front electrode current collectors 161, a plurality of rear electrode current collectors 162, and a back surface field (BSF) layer 171. The front electrodes 141 are formed on the emitter layer 120 on portions of the front surface of the substrate 110 on which the anti-reflection layer 130 is not formed. The rear electrode 151 is formed on a rear surface, opposite the front surface of the substrate 110, on which the light is not incident. The front electrode current collectors 161 are spaced apart from the rear electrode 151, positioned in each of the via holes 181 and the emitter layer 120 around the via holes 181, and electrically connected to the front electrodes 141. The rear electrode current collectors 162 are electrically connected to the rear electrode 151 and are spaced apart from one another at a constant distance. The BSF layer 171 is positioned between the substrate 110 and the rear electrode 151.

In the example embodiment, the substrate 110 may be formed of silicon doped with impurities of a first conductive type, for example, a p-type, though not required. Examples of silicon include single crystal silicon, polycrystalline silicon, and amorphous silicon. When the substrate 110 is of a p-type, the substrate 110 includes impurities of a group III element such as boron (B), gallium (Ga), and Indium (In). Alternatively, the substrate 110 may be of an n-type, and/or be formed of other materials than silicon. When the substrate 110 is of the n-type, the substrate 110 may include impurities of a group V element such as phosphor (P), arsenic (As), and antimony (Sb).

The surface of the substrate 110 is textured to form a textured surface corresponding to an uneven surface or having uneven characteristics. The plurality of via holes 181 passing through the substrate 110 are formed at each of crossings of the front electrodes 141 and the front electrode current collectors 161.

The emitter layer 120 is an impurity portion having a second conductive type (for example, an n-type) opposite the first conductive type of the substrate 110. The emitter layer 120 and the substrate 110 form a p-n junction.

A plurality of electron-hole pairs produced by light incident on the substrate 110 are separated into electrons and holes by a built-in potential difference resulting from the p-n junction. Then, the separated electrons move toward the n-type semiconductor, and the separated holes move toward the p-type semiconductor. Thus, when the substrate 110 is of the p-type and the emitter layer 120 is of the n-type, the separated holes and the separated electrons move toward the substrate 110 and the emitter layer 120, respectively. Accordingly, the holes in the substrate 110 and the electrons in the emitter layer 120 become major carriers.

Because the substrate 110 and the emitter layer 120 form the p-n junction, the emitter layer 120 may be of the p-type when the substrate 110 is of the n-type, unlike the embodiment described above. In this case, the separated electrons and the separated holes move toward the substrate 110 and the emitter layer 120, respectively.

Returning to the embodiment when the emitter layer 120 is of the n-type, the emitter layer 120 may be formed by doping the substrate 110 with impurities of a group V element such as P, As, and Sb. On the contrary, when the emitter layer 120 is of the p-type, the emitter layer 120 may be formed by doping the substrate 110 with impurities of a group III element such as B, Ga, and In.

The anti-reflection layer 130 formed of silicon nitride ($SiN_x$) and/or silicon oxide ($SiO_x$) is positioned on the emitter layer 120 formed on the front surface of the substrate 110. The anti-reflection layer 130 reduces a reflectance of light incident on the substrate 110 and increases a selectivity of a predetermined wavelength band, thereby increasing the efficiency of the solar cell 1. The anti-reflection layer 130 may have a thickness of about 70 nm to 80 nm. Alternatively, the anti-reflection layer 130 may be positioned at a side wall of each of the via holes 181. The anti-reflection layer 130 may be omitted, if desired.

Although it is not shown in FIG. 1, the anti-reflection layer 130 and the emitter layer 120 each have an exposing portion (not shown) exposing a portion of an edge of the front surface of the substrate 110, so as to implement an edge isolation of the substrate 110.

The front electrodes 141 are positioned on the emitter layer 120 on the front surface of the substrate 110 and electrically connected to the emitter layer 120. In addition, the front electrodes 141 extend in a fixed direction to be spaced apart from one another at a predetermined distance and cover the via holes 181. FIG. 2 shows that each of the front electrodes 141 occupies a portion of the inside of the via holes 181. However, each of the front electrodes 141 need not occupy the inside of the via holes 181 and may be positioned on a virtual upper surface S1 of the via holes 181. In the embodiment, the front electrodes 141 occupy approximately 0% to 20% of a length H of each of the via holes 181. Namely, the front electrodes 141 occupy approximately 0% to 20% of an inner space defined by the virtual upper surface S1 and a virtual lower surface S2 of the via holes 181. In the embodiment, the virtual upper surface S1 indicates or refers to a virtual surface for an entrance of the via holes 181 positioned on the front surface of the substrate 110, and the virtual lower surface S2 indicates or refers to a virtual surface for an entrance of the via hole 181 positioned on the rear surface of the substrate 110.

The front electrodes 141 collect charges (for example, electrons) moving to the emitter layer 120 and transfer the collected charges to the front electrode current collectors 161 electrically connected to the front electrodes 141 through the via holes 181.

The front electrodes 141 are formed of at least one conductive metal material. More specifically, the front electrodes 141 may be formed of at least one selected from the group consisting of nickel (Ni), copper (Cu), silver (Ag), aluminum (Al), tin (Sn), zinc (Zn), indium (In), titanium (Ti), gold (Au), and a combination thereof. Other conductive metal materials may be used. In the embodiment, the front electrodes 141 contain Ag and Pb (or PbO).

The front electrode current collectors 161 are positioned on the rear surface of the substrate 110. As shown in FIG. 2, the front electrodes 141 occupy a portion of the inner space of the via holes 181, and the front electrode current collectors 161 occupy a remaining portion of the inner space of the via holes 181 that is not occupied by the front electrodes 141. Thus, the front electrode current collectors 161 contact some of the front electrodes 141 in the inner space of the via holes 181 or on the virtual upper surface S1 of the via holes 181. More specifically, the front electrode current collectors 161 occupy approximately 80% to 100% of the length H of each of the via holes 181. Namely, the front electrode current collectors 161 occupy approximately 80% to 100% of the inner space of the via holes 181. Hence, the front electrode current collectors 161 contact the front electrodes 141 in the inner space of the via holes 181 and thus are electrically connected to the front electrodes 141 through the via holes 181. In embodiments of the present invention, the front electrode current collectors 161 occupy an amount of the via holes 181 that corresponds to a height sufficient to contact the anti-reflection layer 130. In other words, the front electrode current collectors 161 fill the via hole to a level of the anti-reflection layer 130.

As above, because a size of the inner space of occupied by the front electrodes 141 is different from a size of the inner space of occupied by the front electrode current collectors 161, an occupying height of each of the front electrodes 141 in the inner space is different from an occupying height of each of the front electrode current collectors 161 in the inner space, as shown in FIG. 2. In the embodiment, the height of the front electrode 141 in the inner space may be measured from the virtual upper surface S1 to an end of the front electrode 141 existing in the inner space of the via holes 181, and the height of the front electrode current collectors 161 in the inner space may be measured from the virtual lower surface S2 to the end of the front electrode 141.

As described above, the front electrodes 141 and the front electrode current collectors 161 inside the via holes 181 have differences in the height and the size, but both the front electrodes 141 and the front electrode current collectors 161 exist in the via holes 181. The front electrode current collectors 161 are referred to as a bus bar and extend in a cross direction of the front electrode current collector 161 and the front electrode 141.

The front electrode current collectors 161 are formed of at least one conductive metal material and are electrically connected to the front electrodes 141 crossing the front electrode current collectors 161 through the via holes 181. As above, because the front electrode current collectors 161 are electrically connected to the front electrodes 141, the front electrode current collectors 161 output charges transferred from the front electrodes 141 to an external device.

In the embodiment, the front electrode current collectors 161 do not contain Pb unlike the front electrodes 141 and may contain a conductive metal material such as Ag. More specifically, the front electrode current collectors 161 may be formed of at least one selected from the group consisting of Ni, Cu, Ag, Al, Sn, Zn, In, Ti, Au, and a combination thereof. Other conductive metal materials may be used. In embodiments, reference to the front electrode current collectors 161 not containing Pb can be referred to as the front electrode current collectors 161 lacking Pb. Additionally, reference to lacking the Pb does not necessarily refer to an amount of Pb that is completely absent. Rather, lacking the Pb refers to a level that is less than a predetermined level or lower, and may refer to amount of Pb that is simply amounts to incidental or unintended contamination of Pb.

The rear electrode 151 is positioned on the rear surface of the substrate 110 to be spaced apart from the front electrode current collectors 161 and is electrically connected to the substrate 110. The rear electrode 151 collects charges (for example, holes) moving to the substrate 110.

The rear electrode 151 is formed of at least one conductive metal material. More specifically, the rear electrode 151 may be formed of at least one selected from the group consisting of Ni, Cu, Ag, Al, Sn, Zn, In, Ti, Au, and a combination thereof. Other conductive metal materials may be used.

A plurality of exposing portions 182 are formed between the rear electrode 151 and the front electrode current collectors 161. More specifically, each of the rear electrode 151, the front electrode current collectors 161, and the emitter layer 120 has the plurality of exposing portions 182 exposing a portion of the rear surface of the substrate 110. Most of the exposing portions 182 are formed around the front electrode current collectors 161. The exposing portions 182 cut off an electrical connection between the front electrode current collectors 161 moving and collecting the electrons or the holes and the rear electrode 151 collecting the holes or the electrons, and thus a smooth movement of the electrons and the holes can be achieved.

The plurality of rear electrode current collectors 162 are positioned on the rear electrode 151. The rear electrode current collectors 162 are formed of a conductive metal material. More specifically, the rear electrode current collectors 162 may be formed of at least one selected from the group consisting of Ni, Cu, Ag, Al, Sn, Zn, In, Ti, Au, and a combination thereof. Other conductive metal materials may be used.

The rear electrode current collectors 162 are positioned to be spaced apart from one another at a constant distance and have a plurality of circle pads. However, the pad may have an oval shape, a quadrangle shape, and/or a rectangular shape extending in a direction parallel to the front electrode current collectors 161. Other shapes may be used.

The rear electrode current collectors 162 output charges (for example, holes) transferred from the rear electrode 151 electrically connected to the rear electrode current collectors 162 to an external device.

As above, because all of the front electrodes 141, the front electrode current collectors 161, the rear electrode 151, and the rear electrode current collectors 162 contain the conductive metal material and transfer charges, they may serve as a conductor.

The BSF layer 171 is positioned between the rear electrode 151 and the substrate 110. The BSF layer 171 is an area (for example, a $p^+$-type area) that is more heavily doped with impurities of the same conductive type as the substrate 110 than the substrate 110. The movement of electrons to the rear surface of the substrate 110 is disturbed by a potential barrier resulting from a difference between impurity doping concentrations of the substrate 110 and the BSF layer 171. Accordingly, the BSF layer 171 prevents or reduces a recombination and/or a disappearance of the electrons and holes in an interface of the substrate 110 and the rear electrode 151.

The solar cell 1 according to the embodiment having the above-described structure is a metal wrap through (MWT) solar cell in which the front electrode current collectors 161 connected to the front electrodes 141 are positioned on the rear surface of the substrate 110 on which light is not incident. An operation of the solar cell 1 will be below described in detail.

When light irradiated to the solar cell 1 is incident on the substrate 110 through the anti-reflection layer 130 and the emitter layer 120, a plurality of electron-hole pairs are generated in the substrate 110 by light energy based on the incident light. Because the surface of the substrate 110 is a textured surface, a light reflectance in the front surface of the substrate 110 is reduced. Further, because both a light incident operation and a light reflection operation are performed on the textured surface, the light is confined in the solar cell 1. Hence, a light absorption increases, and the efficiency of the solar cell 1 is improved. In addition, because a reflection loss of light incident on the substrate 110 is reduced by the anti-reflection layer 130, an amount of light incident on the substrate 110 further increases.

The electron-hole pairs are separated by the p-n junction of the substrate 110 and the emitter layer 120, and the separated electrons move to the n-type emitter layer 120 and the separated holes move to the p-type substrate 110. The electrons moving to the n-type emitter layer 120 are collected by the front electrodes 141 and then are transferred to the front electrode current collectors 161. The holes moving to the p-type substrate 110 are collected by the rear electrode 151 through the BSF layer 171 and then are transferred to the rear electrode current collectors 162. When the front electrode current collectors 161 are connected to the rear electrode current collectors 162 using electric wires (not shown), current flows therein to thereby enable use of the current for electric power.

Because the front electrode current collectors 161 not containing Pb occupy most of the inner space of the via holes 181, a portion of the emitter layer 120 positioned in the inner space of the via holes 181 is reduced or prevented from being damaged by the Pb in a thermal process of the solar cell 1. Accordingly, a leakage current generated when some of charges moving from the front electrodes 141 to the front electrode current collectors 161 move to the substrate 110 through the damaged emitter layer 120 inside the via holes 181 can be reduced or prevented, and the efficiency of the solar cell 1 is improved.

FIGS. 3A to 3H are cross-sectional views sequentially illustrating each of stages in a method of manufacturing a solar cell according to an embodiment.

Figure 3A:
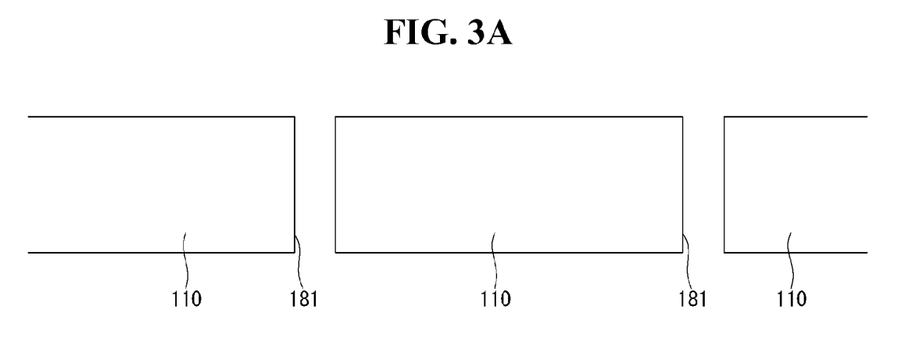

As shown in FIG. 3A, a plurality of via holes 181 are formed on a substrate 110 formed of p-type single crystal silicon or p-type polycrystalline silicon. The via holes 181 are formed through a laser drilling method using a laser beam. Other methods may be used for the via holes 181.

Figure 3B:
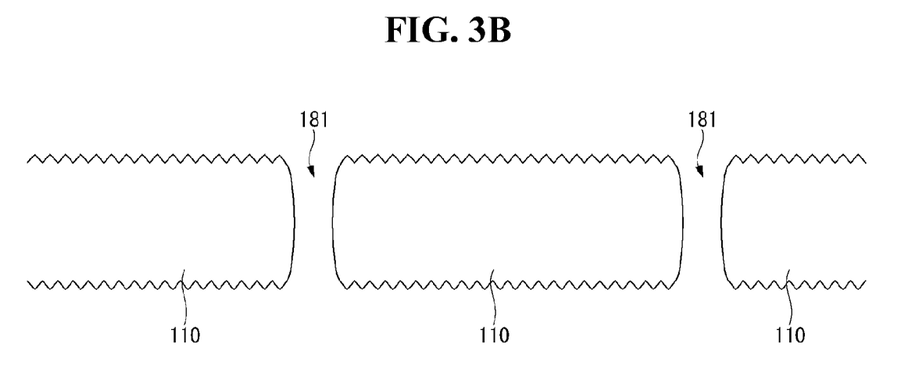

As shown in FIG. 3B, a texturing process is performed on the entire surface of the substrate 110 to form a textured surface of the substrate 110. However, a side wall of each of the via holes 181 does not have the textured surface. When the substrate 110 is formed of p-type single crystal silicon, the texturing process is performed using a basic solution such as KOH, NaOH, and tetramethylammonium hydroxide (TMAH). When the substrate 110 is formed of p-type polycrystalline silicon, the texturing process is performed using an acid solution such as HF and $HNO_3$.

Figure 3C:
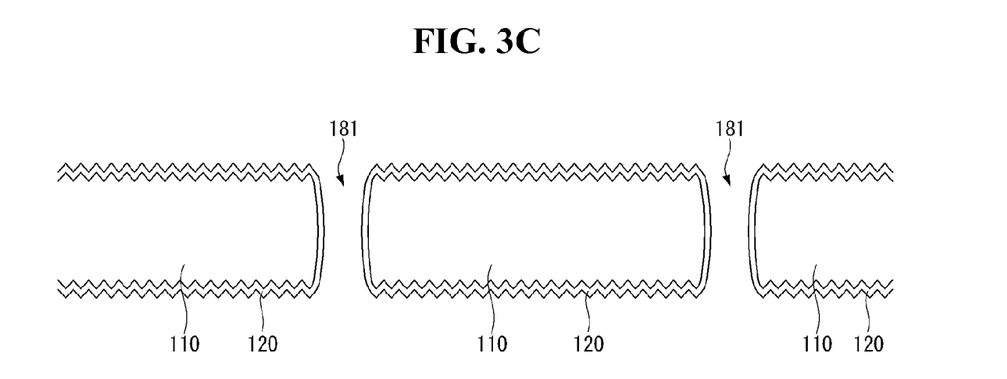

As shown in FIG. 3C, a high temperature thermal process of a material (for example, $POCl_3$ or $H_3PO_4$) containing impurities of a group V element such as P, As, and Sb is performed on the substrate 110 to distribute the group V element impurities on the substrate 110. Hence, an emitter layer 120 is formed on the entire surface of the substrate 110 including a front surface, a rear surface, and an inner surface and a side surface of each of the via holes 181. Unlike the embodiment, when the substrate 110 is of an n-type, a high temperature thermal process of a material (for example, $B_2H_6$) containing group III element impurities is performed on the substrate 110 or the material containing the group III element impurities is stacked on the substrate 110 to form the p-type emitter layer 120 on the entire surface of the substrate 110. Then, phosphorous silicate glass (PSG) containing phosphor (P) or boron silicate glass (BSG) containing boron (B) produced when p-type impurities or n-type impurities are distributed inside the substrate 110 are removed through an etching process.

Figure 3D:
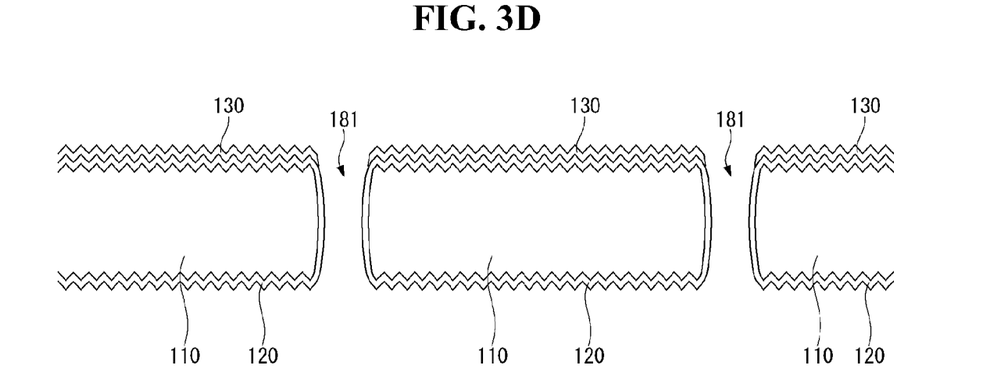

As shown in FIG. 3D, an anti-reflection layer 130 is formed on the front surface of the substrate 110 using a chemical vapor deposition (CVD) method such as a plasma enhanced chemical vapor deposition (PECVD) method. In addition, the anti-reflection layer 130 may be formed inside the via holes 181 or a portion thereof.

Figure 3E:
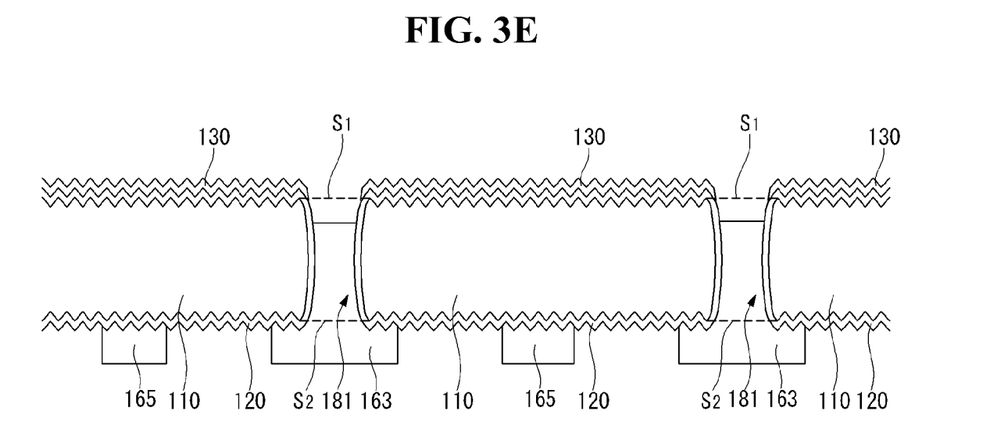

As shown in FIG. 3E, a current collector paste containing Ag is coated on a predetermined portion of the emitter layer 120 on the rear surface of the substrate 110 using a screen printing method to form a front electrode current collector pattern 163 and a rear electrode current collector pattern 165. Then, the front electrode current collector pattern 163 and the rear electrode current collector pattern 165 are dried at about 170° C. The front electrode current collector pattern 163 and the rear electrode current collector pattern 165 do not contain Pb. The front electrode current collector pattern 163 is filled in about 80% to 100% of an inner space of the via hole 181 defined by a virtual upper surface S1 and a virtual lower surface S2. The current collector paste may include at least one selected from the group consisting of Ni, Cu, Al, Sn, Zn, In, Ti, Au, and a combination thereof, instead of Ag. Other conductive metal materials may be used.

Figure 3F:
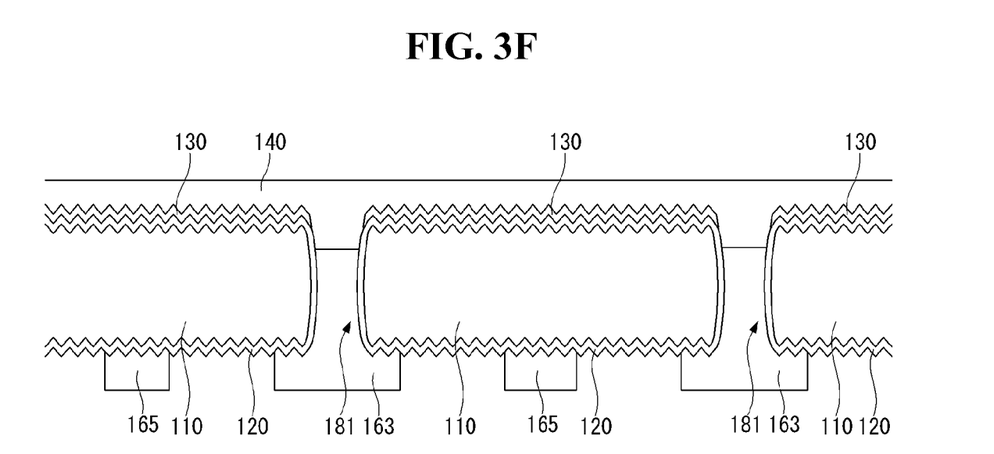

As shown in FIG. 3F, a front electrode paste containing Ag is coated on a predetermined portion of the anti-reflection layer 130 on the front surface of the substrate 110 using the screen printing method, so that the front electrode paste contacts the front electrode current collector pattern 163 filled in at least a portion of the via hole 181 and extends in a fixed direction, to form a front electrode pattern 140. Then, the front electrode pattern 140 is dried at about 170° C. The front electrode pattern 140 is filled in a remaining portion (i.e., about 0% to 20% of the inner space) of the inner space previously occupied by the front electrode current collector pattern 163.

The front electrode paste contains Pb, and a Pb content in the front electrode paste may be approximately 1% to 3% based on total weight of the front electrode paste. Alternatively, the front electrode paste may include at least one selected from the group consisting of Ni, Cu, Al, Sn, Zn, In, Ti, Au, and a combination thereof, instead of Ag. Other conductive metal materials may be used.

As above, the previously coated front electrode current collector pattern 163 occupies equal to or greater than one half of the inner space of the via hole 181, and the front electrode pattern 140 occupies a remaining portion of the inner space. In embodiments of the present invention, the front electrode current collector pattern 163, the rear electrode current collector pattern 165 and/or the front electrode pattern 140 may be coated simultaneously and the firing thereof may occur together.

Figure 3G:
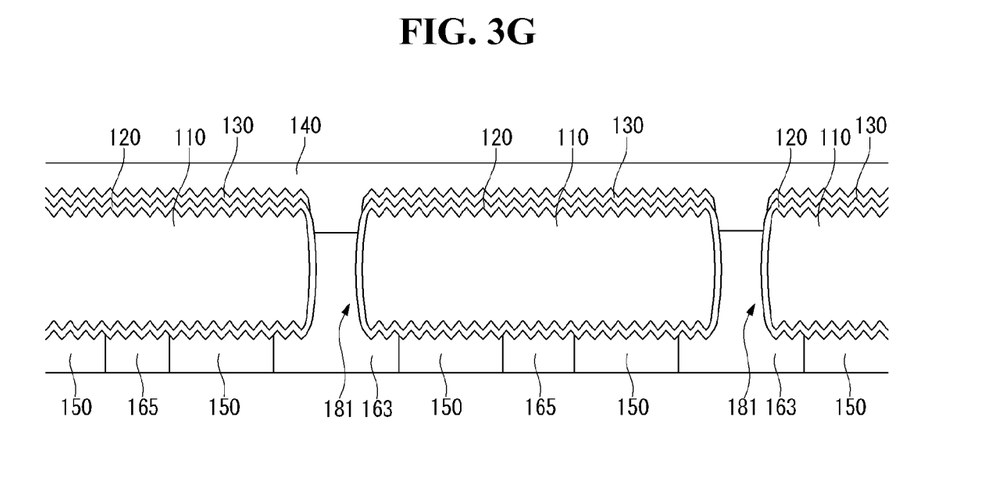

As shown in FIG. 3G, a rear electrode paste is coated on a remaining portion excluding a formation portion of the front electrode current collector pattern 163 and the rear electrode current collector pattern 165 from the rear surface of the substrate 110 to form a rear electrode pattern 150. Then, the rear electrode pattern 150 is dried at about 170° C. The rear electrode paste includes Al and may include at least one selected from the group consisting of Al, Ag, Ni, Cu, Sn, Zn, In, Ti, Au, and a combination thereof. Other conductive metal materials may be used.

In the embodiment, a formation order of the patterns 140, 150, 163, and 165 may vary so that the patterns 140, 150, 163 and 165 are patterned together or separately and/or are fired together or separately.

Figure 3H:
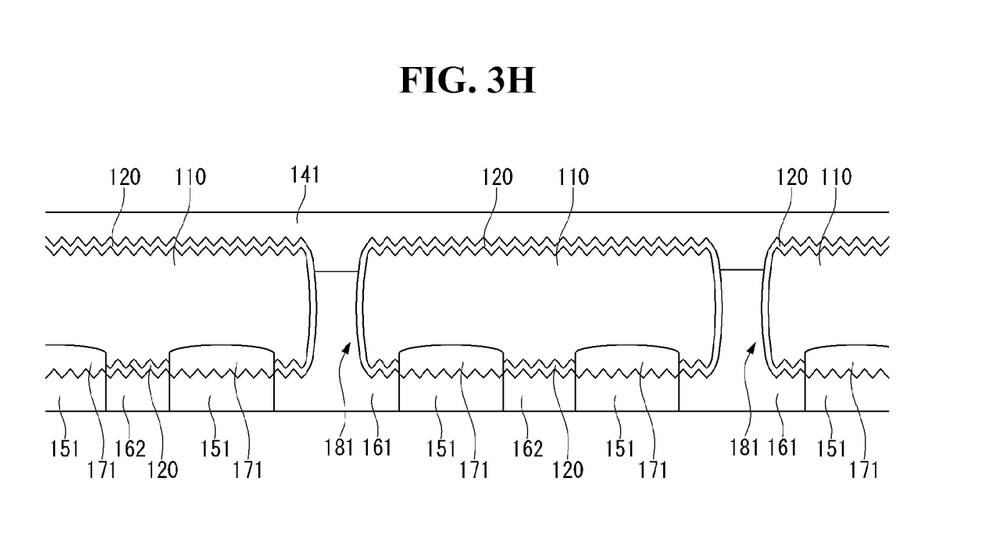

The substrate 110 is fired at a temperature of about 750° C. to 800° C. to form a plurality of front electrodes 141, a plurality of front electrode current collectors 161 electrically connected to the front electrodes 141, a rear electrode 151 connected to the substrate 110, a plurality of rear electrode current collectors 162 electrically connected to the rear electrode 151, and a BSF layer 171 (refer to FIG. 3H). More specifically, when the thermal process is performed, the front electrode pattern 140 passes through the anti-reflection layer 130 and contacts the emitter layer 120 by a punch-through phenomenon, in which the front electrode pattern 140 passes through a portion of the anti-reflection layer 130 contacting the front electrode pattern 140 due to Pb contained in the front electrode pattern 140, to form the plurality of front electrodes 141.

In addition, as shown in FIG. 3H, Al contained in the rear electrode pattern 150 is distributed to the substrate 110 contacting the rear electrode pattern 150 to form the BSF layer 171 between the rear electrode pattern 150 and the substrate 110. The BSF layer 171 is an area doped with impurities of the same conductive type as the substrate 110 and is doped with p-type impurities in the embodiment. An impurity doping concentration of the BSF layer 171 is greater than an impurity doping concentration of the substrate 110, and thus the BSF layer 171 is a p$^+$-type area. Further, metal components contained in each of the patterns 140, 163, 165, and 150 chemically couples with the emitter layer 120 and the substrate 110, and thus a contact resistance is reduced. Hence, a current flow is improved.

Because the front electrode current collector pattern 163 not containing Pb (which generates the punch-through phenomenon) occupies most of the inner space of the via holes 181, the emitter layer 120 inside the via holes 181 is reduced or prevented from being damaged by the punch-through phenomenon.

As described above, a Pb content in the front electrode paste forming the front electrode pattern 140 may be approximately 1% to 3% based on the total weight of the front electrode paste. When the Pb content is equal to or less than about 1%, the punch-through phenomenon does not reach the emitter layer 120. When the Pb content is equal to or greater than about 3%, the punch-through phenomenon may reach the substrate 110.

Figure 4:
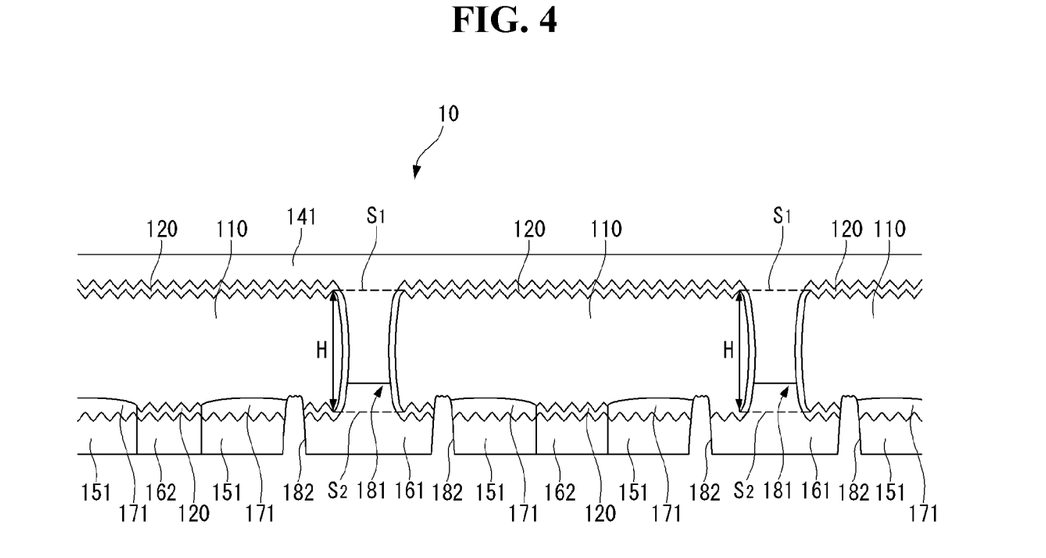
FIG. 4 is a cross-sectional view of a solar cell according to another example embodiment taken along the line II-II of FIG. 1.

Next, a plurality of exposing portions 182 (for example, as shown in FIG. 4) exposing a portion of the substrate 110 are formed around the front electrode current collectors 161 using a laser to electrically separate the rear electrode 151 electrically connected to the substrate 110 from the front electrode current collectors 161. Further, a portion of the anti-reflection layer 130 formed at an edge of the front surface of the substrate 110 and a portion of the emitter layer 120 underlying the anti-reflection layer 130 are removed to form an exposing portion (not shown) exposing a portion of the front surface of the substrate 110. Hence, an edge isolation of the substrate 110 is implemented through the exposing portion. In addition, the exposing portions 182 and the exposing portion used in the edge isolation may be formed using a PECVD method instead of the laser. Finally, the solar cell 1 shown in FIGS. 1 and 2 is completed.

FIG. 4 is a cross-sectional view of a solar cell according to another example embodiment taken along the line II-II of FIG. 1. In the following explanations, structural elements having the same functions and structures as those illustrated in FIG. 1 are designated by the same reference numerals, and a further description may be briefly made or may be entirely omitted.

A solar cell 10 shown in FIG. 4 has a configuration similar to the solar cell 1 shown in FIG. 1. More specifically, the solar cell 10 includes a substrate 110 having a plurality of via holes 181, an emitter layer 120 on the substrate 110, an anti-reflection layer 130 (not depicted) on the emitter layer 120, a plurality of front electrodes 141 on the emitter layer 120, a rear electrode 151 on a rear surface of the substrate 110, a plurality of front electrode current collectors 161 that are electrically separated from the rear electrode 151 and are electrically connected to the front electrodes 141 through the via holes 181, a plurality of rear electrode current collectors 162 electrically connected to the rear electrode 151, and a back surface field (BSF) layer 171 between the substrate 110 and the rear electrode 151.

In the solar cell 10, an occupying ratio of the front electrode 141 and the front electrode current collectors 161 in an inner space of each of the via holes 181 is different from an occupying ratio illustrated in FIG. 1. More specifically, in the solar cell 10, the front electrodes 141 containing Pb occupy most of the inner space of the via holes 181, for example, about 80% to 100% of the inner space. Further, the front electrode current collectors 161 not containing Pb occupy a remaining portion of the inner space, for example, about 0% to 20% of the inner space. The front electrodes 141 and the front electrode current collectors 161 inside the via holes 181 in FIG. 4 are different from those in FIG. 2 in an amount and a location. However, both the front electrodes 141 and the front electrode current collectors 161 in FIG. 4 exist in the via holes 181 in the same manner as FIG. 2. As above, because the front electrodes 141 containing Pb occupy most of the inner space of each of the via holes 181, a mobility of charges moving from the front electrodes 141 to the front electrode current collectors 161 increases. In other words, a conductivity of the front electrodes 141 is greater than a conductivity of the front electrode current collectors 161 because of a conductive metal material, Pb. Accordingly, because the charges are transferred to the front electrode current collectors 161 through the front electrodes 141 occupying most of the inner space, a mobility of the charges increases.

A method of manufacturing the solar cell 10 will be described below with reference to FIGS. 5A to 5D as well as FIGS. 3A to 3H.

FIGS. 5A to 5D are cross-sectional views sequentially illustrating each of stages in a method of manufacturing a solar cell according to another example embodiment.

As described above with reference to FIGS. 3A to 3D, a plurality of via holes 181 are formed on a substrate 110 formed of silicon, and a texturing process is performed on the entire surface of the substrate 110 to form a textured surface of the substrate 110. Then, impurities of a conductive type opposite a conductive type of the substrate 110 are injected into the substrate 110 to form an emitter layer 120. An anti-reflection layer 130 is formed on a front surface of the substrate 110.

Figure 5A:
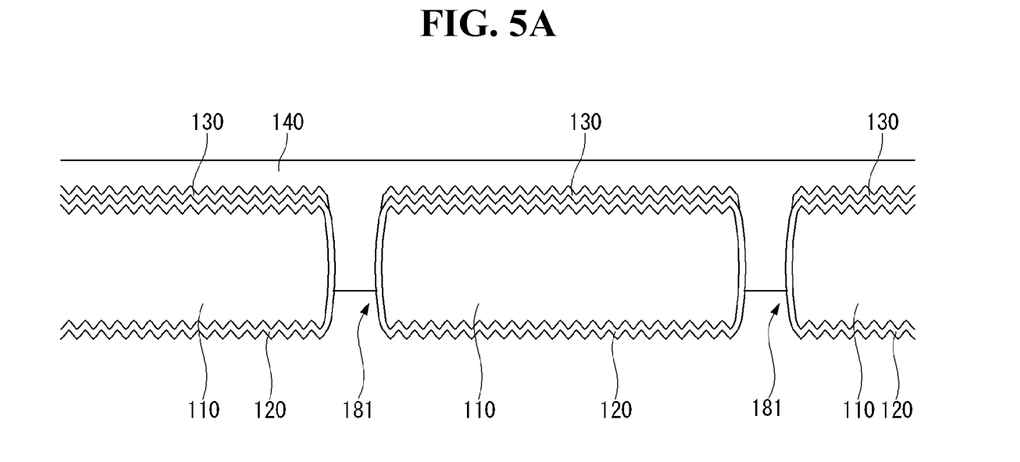
Figure 5B:
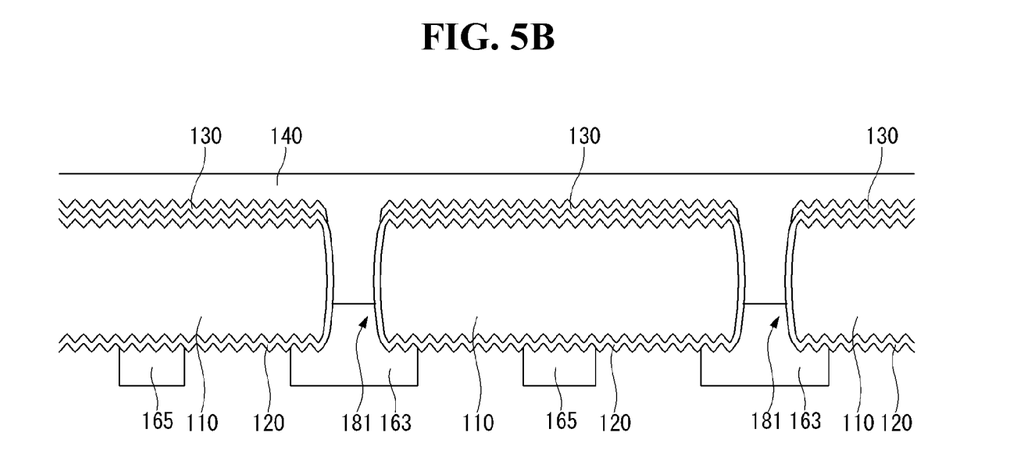

Next, unlike a process illustrated in FIGS. 3E and 3F, as shown in FIGS. 5A and 5B, a front electrode paste is coated on a predetermined portion of the front surface of the substrate 110 using a screen printing method to form a front electrode pattern 140. Then, a current collector paste is coated on a predetermined portion of the emitter layer 120 on a rear surface of the substrate 110 to form a front electrode current collector pattern 163 and a rear electrode current collector pattern 165. The front electrode paste contains Pb of about 1% to 3% based on total weight of the front electrode paste.

As above, because the front electrode pattern 140 is printed earlier than the front electrode current collector pattern 163, the front electrode pattern 140 is filled in about 80% to 100% of an inner space of each of the via holes 181, and the front electrode current collector pattern 163 is filled in a remaining portion (i.e., about 0% to 20% of the inner space).

Figure 5C:
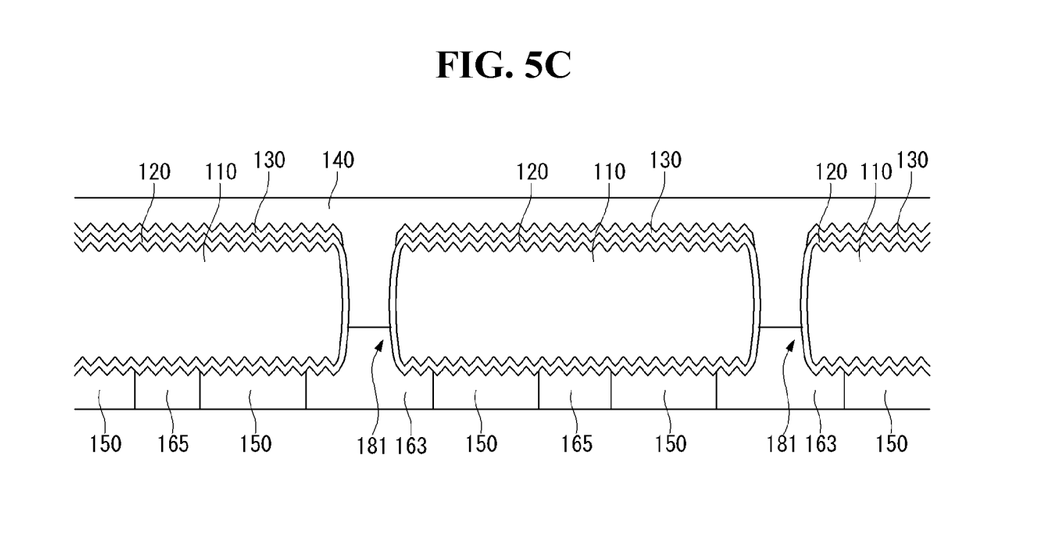
Figure 5D:
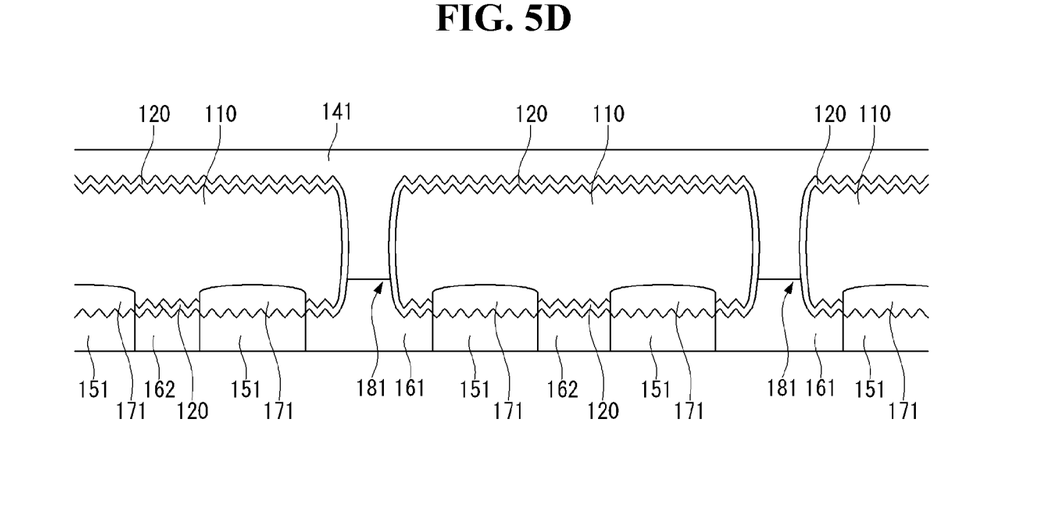

As shown in FIGS. 3G and 3H, a rear electrode paste is coated on a remaining portion excluding a formation portion of the front electrode current collector pattern 163 and the rear electrode current collector pattern 165 from the rear surface of the substrate 110 using the screen printing method to form a rear electrode pattern 150. Then, as shown in FIG. 5C, the rear electrode pattern 150 is dried. As shown in FIG. 5D, a thermal process is performed on a resulting structure to form a plurality of front electrodes 141 electrically connected to the emitter layer 120, a plurality of front electrode current collectors 161 electrically connected to the front electrodes 141, a rear electrode 151, a plurality of rear electrode current collectors 162 electrically connected to the rear electrode 151, and a BSF layer 171 between the substrate 110 and the rear electrode 151.

Next, a plurality of exposing portions 182 (for example, as shown in FIG. 4) exposing a portion of the substrate 110 are formed around the front electrode current collectors 161 using a laser to electrically separate the rear electrode 151 from the front electrode current collectors 161. Further, an edge isolation of the substrate 110 is implemented. Finally, the solar cell 10 shown in FIG. 4 is completed.

As described above, in the solar cell according to the example embodiments, because both a conductor containing Pb and a conductor not containing Pb are positioned in the inner space of the via hole, an amount of leakage current in the inner space of the via hole is reduced, and a mobility of charges in the inner space of the via hole is improved. Hence, the efficiency of the solar cell is improved.

In embodiments of the invention, reference to front or back, with respect to electrode, a surface of the substrate, or others is not limiting. For example, such a reference is for convenience of description since front or back is easily understood as examples of first or second of the electrode, the surface of the substrate or others.

While this invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A solar cell comprising:
   a semiconductor substrate of a first conductive type having at least one via hole, and including crystal silicon;
   an emitter layer of a second conductive type forming a p-n junction with the semiconductor substrate, and directly positioned on a first surface of the semiconductor substrate and a second surface of the semiconductor substrate opposite the first surface;
   a first conductor directly positioned on the emitter layer at the first surface of the semiconductor substrate, and a portion of the first conductor being positioned inside the at least one via hole;
   a second conductor directly positioned on the emitter layer at the second surface of the semiconductor substrate, and a portion of the second conductor being positioned inside the at least one via hole; and
   a third conductor positioned on the second surface of the semiconductor substrate and connected to the semiconductor substrate, the third conductor being physically separated from the second conductor and the emitter layer at the second surface of the semiconductor substrate,
   wherein the first conductor directly contacts with the second conductor inside the at least one via hole of the semiconductor substrate and a material of the first conductor and a material of the second conductor are different.

2. The solar cell of claim 1, wherein one of the first conductor and the second conductor contains lead (Pb).

3. The solar cell of claim 2, wherein the first conductor contains Pb.

4. The solar cell of claim 1, wherein a height of the portion of the first conductor inside the at least one via hole is different from a height of the portion of the second conductor inside the at least one via hole.

5. The solar cell of claim 4, wherein the second conductor and the third conductor are positioned on a same stratum.

6. The solar cell of claim 1, wherein the at least one via hole of the semiconductor substrate comprises first and second portions,
   the first portion of the at least one via hole is closer to the first surface of the semiconductor substrate than the second portion of the at least one via hole, and
   an amount of Pb in the first portion of the at least one via hole is greater than an amount of Pb in the second portion of the at least one via hole.

7. The solar cell of claim 6, wherein the second portion lacks Pb.

8. The solar cell of claim 1, further comprising an anti-reflection layer on the emitter layer and a portion of the at least one via hole.

9. The Solar cell of claim 1, wherein a portion of the emitter layer is further formed inside the at least one via hole.

* * * * *